(12) United States Patent
Fujii

(10) Patent No.: US 11,418,371 B2
(45) Date of Patent: Aug. 16, 2022

(54) SEMICONDUCTOR INTEGRATED CIRCUIT, RECEIVING APPARATUS, AND MEMORY DEVICE

(71) Applicant: Kioxia Corporation, Tokyo (JP)

(72) Inventor: Shinsuke Fujii, Ota (JP)

(73) Assignee: Kioxia Corporation, Tokyo (JP)

( * ) Notice: Subject to any disclaimer, the term of this patent is extended or adjusted under 35 U.S.C. 154(b) by 156 days.

(21) Appl. No.: 17/014,237

(22) Filed: Sep. 8, 2020

(65) Prior Publication Data
US 2021/0297295 A1 Sep. 23, 2021

(30) Foreign Application Priority Data
Mar. 18, 2020 (JP) .............................. JP2020-047211

(51) Int. Cl.
| | |
|---|---|
| H03G 3/20 | (2006.01) |
| H04L 25/03 | (2006.01) |
| G06F 13/42 | (2006.01) |
| H03G 3/30 | (2006.01) |
| G11C 7/10 | (2006.01) |

(52) U.S. Cl.
CPC .... *H04L 25/03885* (2013.01); *G06F 13/4221* (2013.01); *G11C 7/1096* (2013.01); *H03G 3/3042* (2013.01); *H03G 3/3094* (2013.01)

(58) Field of Classification Search
CPC combination set(s) only.
See application file for complete search history.

(56) References Cited

U.S. PATENT DOCUMENTS

| | | | |
|---|---|---|---|
| 8,401,065 B2 | 3/2013 | Hidaka | |
| 9,191,244 B2* | 11/2015 | Tan | .................. H04L 25/03343 |
| 9,654,327 B2 | 5/2017 | Liao et al. | |
| 10,270,543 B2 | 4/2019 | Iwai | |
| 11,137,793 B2* | 10/2021 | Takada | ..................... H04B 1/16 |
| 2019/0052488 A1 | 2/2019 | Fujii et al. | |

FOREIGN PATENT DOCUMENTS

| | | |
|---|---|---|
| JP | 5853751 B2 | 2/2016 |
| JP | 2018-524855 A | 8/2018 |
| JP | 2019-033476 A | 2/2019 |
| JP | 6571133 B2 | 9/2019 |

* cited by examiner

*Primary Examiner* — Long Nguyen
(74) *Attorney, Agent, or Firm* — Oblon, McClelland, Maier & Neustadt, L.L.P.

(57) ABSTRACT

According to one embodiment, in a semiconductor integrated circuit, the second circuit samples an amplitude of the output second signal at a plurality of timings every given cycle in a period corresponding to a second period of the pattern. The second circuit controls a parameter relating to the frequency characteristic for the first circuit according to a first magnitude relation and a second magnitude relation. The first magnitude relation is a relation between an absolute value of a first amplitude and a first threshold. The first amplitude is an amplitude sampled at a first timing among the plurality of timings. The second magnitude relation is a relation between an absolute value of a second amplitude and the first threshold. The second amplitude is an amplitude sampled at a second timing. The second timing is a timing after the first timing among the plurality of timings.

20 Claims, 14 Drawing Sheets

SEMICONDUCTOR INTEGRATED CIRCUIT, RECEIVING APPARATUS, AND MEMORY DEVICE

CROSS-REFERENCE TO RELATED APPLICATIONS

This application is based upon and claims the benefit of priority from Japanese Patent Application No. 2020-047211, filed on Mar. 18, 2020; the entire contents of which are incorporated herein by reference.

FIELD

Embodiments described herein relate generally to a semiconductor integrated circuit, a receiving apparatus, and a memory device.

BACKGROUND

In a communication system, wired communication may be performed by connecting a transmitting apparatus and a receiving apparatus via a wired communication path. At this time, it is preferable to properly perform the wired communication.

DETAILED DESCRIPTION

In general, according to one embodiment, there is provided a semiconductor integrated circuit including a first circuit and a second circuit. The first circuit outputs a second signal obtained by changing a frequency characteristic of a first signal. The first signal includes a pattern that has a first period and has a second period after the first period. The first period is a period in which the first signal has a first level. The second period is a period in which the first signal has a second level. The second level is different from the first level. The second circuit samples an amplitude of the output second signal at a plurality of timings every given cycle in a period corresponding to the second period of the pattern. The second circuit controls a parameter relating to the frequency characteristic for the first circuit according to a first magnitude relation and a second magnitude relation. The first magnitude relation is a relation between an absolute value of a first amplitude and a first threshold. The first amplitude is an amplitude sampled at a first timing among the plurality of timings. The second magnitude relation is a relation between an absolute value of a second amplitude and the first threshold. The second amplitude is an amplitude sampled at a second timing. The second timing is a timing after the first timing among the plurality of timings.

Exemplary embodiments of a receiving apparatus will be explained below in detail with reference to the accompanying drawings. The present invention is not limited to the following embodiments.

Embodiment

Figure 1:
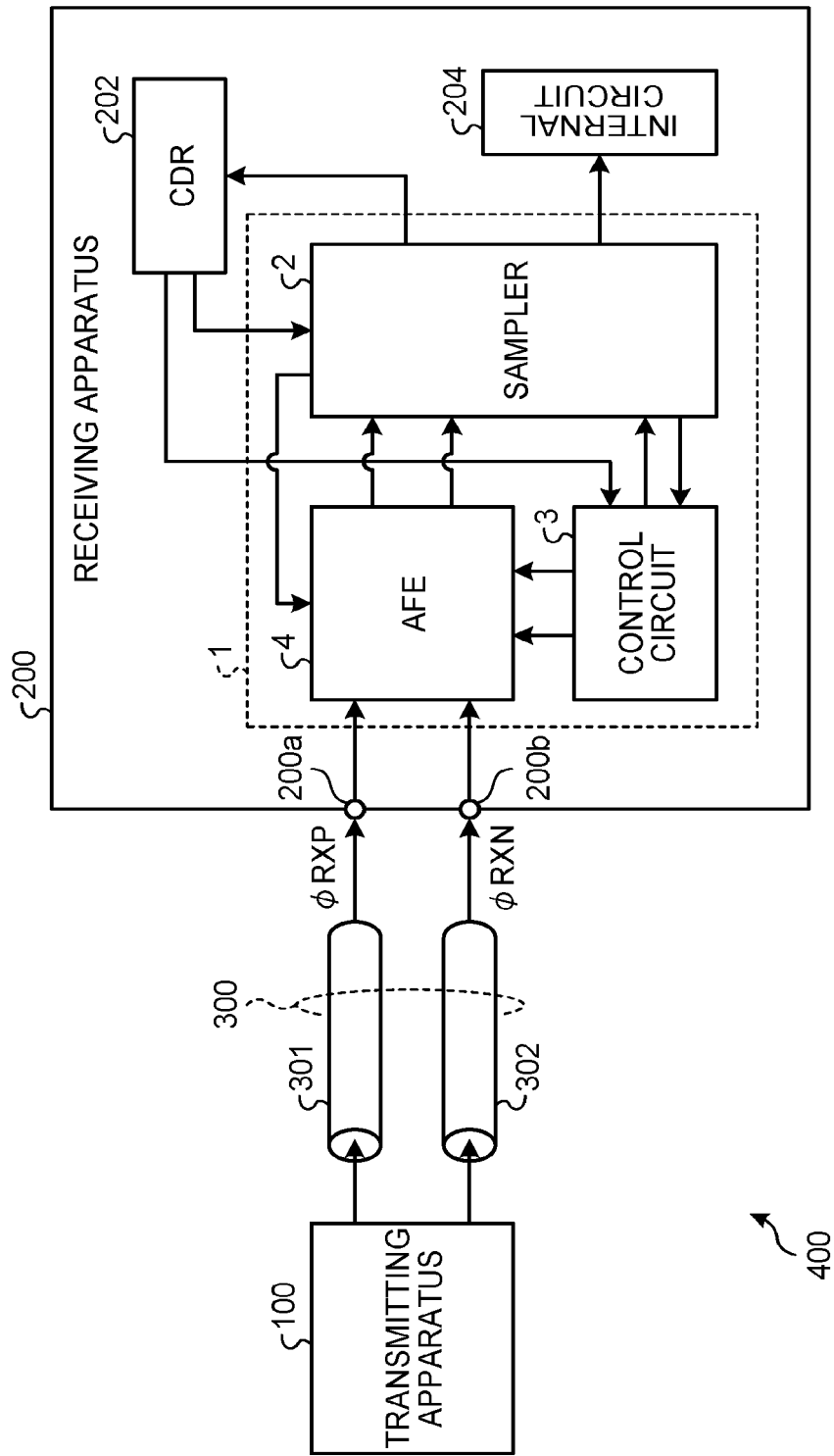
FIG. 1 is a diagram illustrating a configuration of a communication system including a receiving apparatus including a semiconductor integrated circuit according to an embodiment.

A semiconductor integrated circuit according to an embodiment is used, for example, in a communication system that performs wired communication. For example, a communication system 400 to which the semiconductor integrated circuit 1 is applied is configured as illustrated in FIG. 1. FIG. 1 is a diagram illustrating a configuration of the communication system 400 to which the semiconductor integrated circuit 1 is applied.

The communication system 400 has a transmitting apparatus 100, a receiving apparatus 200, and a wired communication path 300. The transmitting apparatus 100 and the receiving apparatus 200 are communicably connected via the wired communication path 300. The transmitting apparatus 100 transmits particular data to the receiving apparatus 200 via the wired communication path 300. The wired communication path 300 is differentially configured and has a P-side communication path 301 and an N-side communication path 302. The receiving apparatus 200 receives particular data from the transmitting apparatus 100 via the wired communication path 300. The receiving apparatus 200 includes receiving nodes 200a and 200b, the semiconductor integrated circuit 1, a clock data recovery (CDR) circuit 202, and an internal circuit 204. The communication path 301 and 302 of the wired communication path 300 may be connected to the receiving nodes 200a and 200b, respectively. The semiconductor integrated circuit 1 is arranged on output sides of the receiving nodes 200a and 200b.

Figure 2:
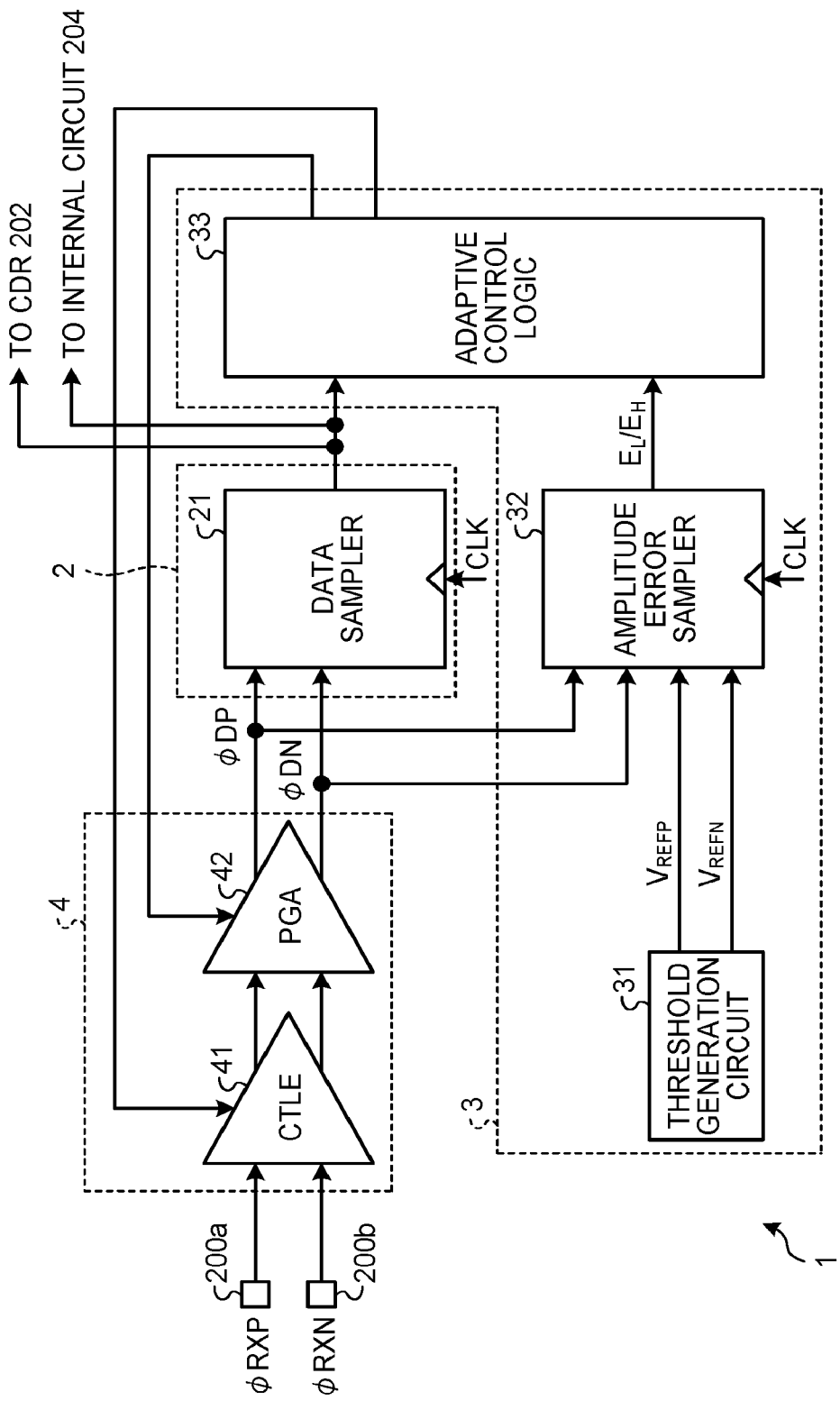
FIG. 2 is a diagram illustrating a configuration of the semiconductor integrated circuit according to the embodiment.

The semiconductor integrated circuit 1 includes an analog front end (AFE) 4, a sampler 2, and a control circuit (second circuit) 3. The semiconductor integrated circuit 1 may be configured as illustrated in FIG. 2, for example. FIG. 2 is a diagram illustrating a configuration of the semiconductor integrated circuit 1.

The AFE 4 is electrically connected between the receiving nodes 200a and 200b and the sampler 2. The AFE 4 performs analog signal processing on signals φRXP and φRXN received via the receiving nodes 200a and 200b, and supplies processed data signals φDP, φDN to the sampler 2.

The AFE 4 includes an equalizer circuit (first circuit) 41 and an amplifier circuit 42. The equalizer circuit 41 may be implemented as a continuous time linear equalizer (CTLE) circuit. The amplifier circuit 42 may be implemented as a programmable gain amplifier (PGA). The equalizer circuit 41 is electrically connected between the receiving nodes 200a and 200b and the amplifier circuit 42. The amplifier circuit 42 is electrically connected between the equalizer circuit 41 and the sampler 2.

The equalizer circuit 41 receives differential signals φRXP and φRXN via the receiving nodes 200a and 200b, respectively. The equalizer circuit 41 performs waveform equalization on the signals φRXP and φRXN (first signal) by amplifying a high frequency component of the signal attenuated in the wired communication path 300, and supplies the equalized signal (second signal) to the amplifier circuit 42. The amplifier circuit 42 amplifies the signal equalized by the equalizer circuit 41 and transmits the amplified data signals φDP and φDN to the sampler 2 side. The equalizer circuit 41 performs the waveform equalization using parameters relating to frequency characteristics including a boost amount. That is, the equalizer circuit 41 performs the waveform equalization by changing the frequency characteristics.

The sampler 2 is electrically connected to an output node of the AFE 4 and is electrically connected to an output node of the CDR 202. The sampler 2 performs sampling processing on the signals φRXP and φRXN received from the AFE 4 in synchronization with a sampling clock CLK received from the CDR 202, and outputs the sampling result to the CDR 202 and the internal circuit 204.

The sampler 2 includes a data sampler 21. The data sampler 21 may be configured as a flip-flop. The data sampler 21 receives the differential data signals φDP and φDN from the AFE 4. The data sampler 21 identifies data values for the data signals φDP and φDN by comparing the amplitudes of the data signals φDP and φDN with particular thresholds, and supplies the identification results of the data value to the CDR 202, the internal circuit 204, and the control circuit 3.

The attenuation characteristics of the signal by the wired communication path 300 tend to greatly attenuate the signal amplitude in the high frequency region than in the low frequency region, and as a result, intersymbol interference (ISI) occurs. Signals that are temporally ahead of and behind a current signal affect the current signal due to the ISI, and therefore the current signal are distorted. The equalizer circuit 41 boosts the high frequency component of the signal as compared with the low frequency component of the signal to compensate for the influence of the ISI, thereby reduces the distortion of the signal. When the boost amount is larger than the appropriate amount, the compensation by the CTLE becomes excessive. Therefore, an output waveform of the equalizer circuit 41 may excessively change with respect to a pulse waveform (i.e., square waveform) to be transmitted and may thus be distorted. When the boost amount becomes smaller than the appropriate amount, the compensation by the CTLE becomes insufficient. Therefore, the output waveform of the equalizer circuit 41 may be distorted so as to have a blunt waveform with respect to the pulse waveform to be transmitted.

For example, a unit period of the waveform processing is one unit interval (one UI). The one UI corresponds to one cycle or a half cycle of the sampling clock CLK, and corresponds to one bit of the sampling result of the data sampler 21. In addition, a transmission data is one pulse signal, one pulse in a received waveform is set to be a target bit and an amplitude thereof is set to be $h_0$, and each amplitude before one to two UIs is set to be $h_{-1}$ to $h_{-2}$, and each amplitude after one to four UIs is set to be $h_1$ to $h_4$. At this time, in order to adaptively control the boost amount of the equalizer circuit 41 in parallel with the actual operation, it is considered to calculate the compensation error of the equalizer circuit 41 using two filter patterns FP0 and FP1, respectively, of multiple bits (for example, seven bits) that are included in the received data pattern and are different from each other by one bit. For example, when reducing the ISI of the amplitude $h_1$, the two filter patterns FP0 and FP1 each that include seven bits $D_0$ to $D_6$ corresponding to amplitudes $h_4$ to $h_{-2}$ and are different only in a value of a fourth bit $D_3$ are used. The difference in the ISI that the amplitude $h_0$ of a fifth bit $D_4$ of the filter patterns FP0 and FP1 undergoes is determined by the difference in the amplitude $h_1$ of the fourth bit $D_3$ before one UI of the fifth bit $D_4$, and is thus $2 \times h_1$. When the amplitude $h_0$ of the fifth bit $D_4$ of the filter pattern FP0 and the amplitude $h_0$ of the fifth bit $D_4$ of the filter pattern FP1 match each other, the difference in ISI that the amplitude $h_1$ undergoes becomes approximately 0, and the ISI of the amplitude $h_1$ can be reduced.

However, in the adaptive control in parallel with the actual operation, it is necessary to wait for the calculation of the ISI compensation error until both of the two filter patterns appear in the received data pattern. Therefore, the time required for the adaptive control tends to be long. Further, for the target bit, if the number of bits of the filter pattern becomes long to reduce the error due to the influence of the ISI from the past, the time required for the adaptive control also tends to be long due to the increase in the number of bits.

For example, in the above-described example, since the two filter patterns in which 0/1 is different in the first bit are used for detecting the amplitude $h_4$, the influence of the ISI after the amplitude $h_5$ is large. If the filter pattern is lengthened and thus includes bits that are earlier in time than the first bit, the number of bits of the filter pattern becomes long and the frequency of receiving this filter pattern decreases, so the time required for the adaptive control can be even longer.

Therefore, the semiconductor integrated circuit 1 of the present embodiment can adaptively control the AFE 4 including the equalizer circuit 41 and the amplifier circuit 42 depending on the magnitude relation between an absolute value of differential amplitude of data obtained by sampling at a plurality of timings in a latter half period of a step response filter pattern and an absolute value of the threshold. Here, the differential amplitude of the data indicates the amplitude of the differential signal waveform of the filter pattern. With such a configuration, the quickness and high accuracy of the adaptive control of the equalizer circuit 41 and the amplifier circuit 42 may be promoted.

Specifically, as the sampling result of the differential amplitude of the data, the semiconductor integrated circuit 1 uses, as one filter pattern, a data pattern (pattern having a relatively low frequency) having a second period in which second data value different from first data value continues Y times (Y is an integer of two or more) after a first period in which the first data value continues X times (X is an integer of two or more). When receiving the data pattern, the semiconductor integrated circuit 1 acquires an absolute value of a differential amplitude of a data sampled at a first timing in the second period in which the second data value continues Y times and an absolute value of a differential amplitude of a data sampled at a second timing different from the first timing in the second period. When the communication scheme is binary amplitude modulation (that is, NRZ), the second period in which the second data value continues Y times is a period corresponding to Y bits, and the first timing and the second timing may be M-th (M is an integer that satisfies 1<M<Y) bit sampling timing, and N-th (N is an integer that satisfies 1<N<Y and M<N) bit sampling timing, respectively. The semiconductor integrated circuit 1 sets an amplitude threshold corresponding to an appropriate differential amplitude in advance. The semiconductor integrated circuit 1 can indirectly understand a degree of distortion of a waveform of the sampled data pattern by referring to a first magnitude relationship between the absolute value of the differential amplitude of the data at the first timing and an amplitude threshold, and a second magnitude relationship between the absolute value of the differential amplitude of the data at the second timing and an amplitude threshold. For example, when the absolute value of the differential amplitude of the data at the first timing is larger than an absolute value of the amplitude threshold, and when the absolute value of the differential amplitude of the data at the second timing is smaller than an absolute value of the amplitude threshold, the semiconductor integrated circuit 1 reduces the boost amount (frequency characteristics) of the equalizer circuit 41 because it can be expected that the waveform is distorted in an overcompensated state. For example, when the absolute value of the differential amplitude of the data at the first timing is smaller than the absolute value of the amplitude threshold, and when the absolute value of the differential amplitude of the data at the second timing is larger than the absolute value of the amplitude threshold, the semiconductor integrated circuit 1 increases the boost amount of the equalizer circuit 41 because it can be expected that the waveform is distorted in an undercompensated state. That is, the semiconductor integrated circuit 1 can adaptively control the equalizer circuit 41 depending on the magnitude relation between the absolute value of the differential amplitude and the absolute value of the amplitude threshold that are indicated by the two sampling result while using, as one filter pattern, a data pattern in which the second data value continues plural times after the first data value continues plural times. Thereby, the adaptive control of the boost amount of the equalizer circuit 41 may be performed in a short time and with high accuracy. Note that when the sampling result is a positive value, the value of the differential amplitude of the data and the amplitude threshold themselves may be used instead of the absolute values of the differential amplitude of the data and the amplitude threshold.

More specifically, in the semiconductor integrated circuit 1, the control circuit 3 includes a threshold generation circuit 31, an amplitude error sampler 32, and an adaptive control logic circuit 33.

The threshold generation circuit 31 has an output node connected to the amplitude error sampler 32. The threshold generation circuit 31 generates amplitude thresholds $V_{REFP}$ and $V_{REFN}$ corresponding to target amplitudes of the signal levels of the differential data signals φDP and φDN, and supplies the generated amplitude thresholds $V_{REFP}$ and $V_{REFN}$ to the amplitude error sampler 32.

The amplitude error sampler 32 is electrically connected between the AFE 4, the threshold generation circuit 31, and the adaptive control logic circuit 33. The amplitude error sampler 32 may be configured as a flip-flop. The amplitude error sampler 32 receives the differential data signals φDP and φDN from the AFE 4 and receives the amplitude thresholds $V_{REFP}$ and $V_{REFN}$ from the threshold generation circuit 31. The amplitude error sampler 32 uses the received amplitude thresholds $V_{REFP}$ and $V_{REFN}$ to generate a differential amplitude threshold $V_{REFH}$ (=$V_{REFP}-V_{REFN}$) and a differential amplitude threshold $V_{REFL}$ $V_{REFN}-V_{REFP}$). The amplitude thresholds $V_{REFH}$ and $V_{REFL}$ are thresholds for determining the amplitude error, that is, the degree of waveform distortion. The amplitude threshold $V_{REFH}$ is set to be an amplitude value near a target amplitude of an H level corresponding to a data value "1" of the differential amplitude (φDP-φDN). The amplitude threshold $V_{REFL}$ is set to be an amplitude value near a target amplitude of an L level corresponding to a data value "0" of the differential amplitude (φDP-φDN). The amplitude error sampler 32 compares the differential amplitude (φDP-φDN) of the data signal with the amplitude thresholds $V_{REFH}$ and $V_{REFL}$ in synchronization with the sampling clock CLK received from the CDR 202.

When sampling the period in which the data value "1" continues, the amplitude error sampler 32 outputs an error sampling result $E_H$="1" as a comparison result if the differential amplitude (φDP-φDN) of the data signal>the amplitude threshold $V_{REFH}$, and outputs an error sampling result $E_H$="0" as a comparison result if the differential amplitude (φDP-φDN) of the data signal<the amplitude threshold $V_{REFH}$. The error sampling result $E_H$="1" indicates that (absolute value of the differential amplitude (φDP-φDN) of data signal)>(absolute value of the amplitude threshold $V_{REFH}$). The error sampling result $E_H$="0" indicates that (absolute value of the differential amplitude (φDP-φDN) of data signal)<(absolute value of the amplitude threshold $V_{REFH}$).

When sampling the period in which the data value "0" continues, the amplitude error sampler 32 outputs an error sampling result $E_L$="1" as a comparison result if the differential amplitude (φDP-φDN) of the data signal<the amplitude threshold $V_{REFL}$, and outputs an error sampling result $E_L$="0" as a comparison result if the differential amplitude (φDP-φDN) of the data signal>the amplitude threshold $V_{REFL}$. The error sampling result $E_L$="1" indicates that (absolute value of the differential amplitude (φDP-φDN) of data signal)>(absolute value of the amplitude threshold $V_{REFL}$). The error sampling result $E_L$="0" indicates that (absolute value of the differential amplitude (φDP-φDN) of data signal)<(absolute value of the amplitude threshold $V_{REFL}$).

The comparison result of the amplitude error sampler 32 is supplied to the adaptive control logic circuit 33, and is used by the adaptive control logic circuit 33 to determine the degree of waveform distortion for the differential amplitude (φDP-φDN) of the data signal.

The adaptive control logic circuit 33 is electrically connected between the data sampler 21, the amplitude error sampler 32, and the AFE 4. The adaptive control logic circuit 33 receives a data value identification result from the data sampler 21, and receives the error sampling results $E_H$ and $E_L$ from the amplitude error sampler 32. The adaptive control logic circuit 33 can control the equalizer circuit 41 by determining the degree of waveform distortion according to the identification result of the data value and the error sampling results $E_H$ and $E_L$.

The adaptive control logic circuit 33 determines whether or not the data pattern according to the identification result of the data value matches the step response filter pattern in which the second data value continues Y times or more after the first data value continues X times or more. The adaptive control logic circuit 33 determines the magnitude relation between the absolute values of the amplitudes of the data signals ϕDP and ϕDN at a plurality of timings and the absolute values of the amplitude thresholds $V_{REFH}$ and $V_{REFL}$ according to the comparison result of the amplitude at a plurality of timings in the period (the latter half period of one cycle of the data pattern) in which the second data value continues when the data pattern matches the step response filter pattern. The adaptive control logic circuit 33 can control the equalizer circuit 41 according to the determination result.

Figure 3:
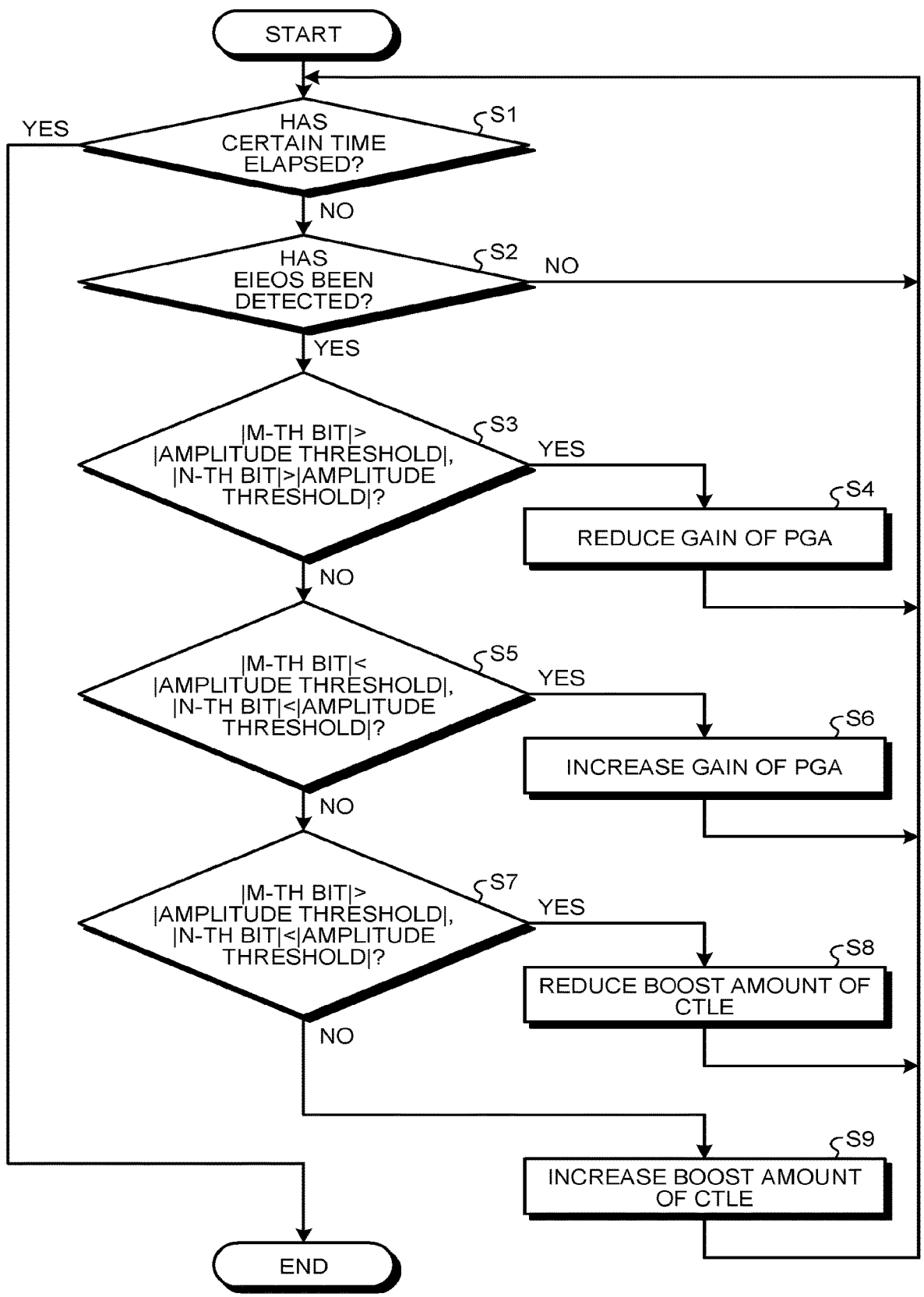
FIG. 3 is a flowchart illustrating an operation of the semiconductor integrated circuit according to the embodiment.

For example, if the wired communication is communication according to the PCIe (Peripheral Component Interconnect Express) (registered trademark) standard, the step response filter pattern can be obtained in a cycle. In the PCIe, the period of the adaptive control of the equalizer circuit is defined, and a low-speed pattern called an electrical idle exit ordered set (EIEOS) is transmitted during this period, and therefore can be used. The EIEOS is a pattern for notifying a receiving destination that the electrical idle (EI) state ends when the transmission of the data signal is restarted. That is, the semiconductor integrated circuit 1 operates as illustrated in FIG. 3 and can perform the adaptive control in a short time. FIG. 3 is a flowchart illustrating the operation of the semiconductor integrated circuit 1.

In the semiconductor integrated circuit 1, the adaptive control logic circuit 33 determines whether or not a certain period has elapsed since a head bit of a given frame of the data signal was received (S1). For example, in the third generation (Gen3) of the PCIe standard, a data transfer rate is 8 Gb/s, and in a signal format, a frame including an EIEOS block of 1 block and a TS1 block of 32 blocks subsequent thereto is cyclically repeated. Alternatively, in the fourth generation (Gen4) of the PCIe standard, a data transfer rate is 16 Gb/s, and in a signal format, a frame including an EIEOS block of one block and a TS1 block of 32 blocks subsequent thereto is cyclically repeated. Even in all generations of the PCIe standard, the TS1 block is scrambled in the signal format, whereas the EIEOS block is not scrambled. Therefore, the adaptive control logic circuit 33 can determine the adaptive control in the EIEOS block at the head of the frame. The adaptive control logic circuit 33 repeats processes of S2 to S9 until the certain period has passed (No in S1), and ends the processes when the certain period has passed (Yes in S1).

When the certain period has not elapsed (No in S1), the adaptive control logic circuit 33 receives the identification result of the data value from the data sampler 21, and determines whether or not the EIEOS block is detected according to the identification result of the data value (S2). When the EIEOS block is not detected (No in S2), the process returns to S1.

For example, in the third generation (Gen3) of the PCIe standard, in the EIEOS block, a data pattern of 8-bit continuous '0' and 8-bit continuous '1' is repeated eight times in the data signal ϕDP. The data pattern corresponds to a filter pattern in which the first data value="0", X=8, the second data value="1", and Y=8. Alternatively, in the fourth generation (Gen4) of the PCIe standard, in the EIEOS block, a data pattern of 16-bit continuous 0 and 16-bit continuous 1 is repeated eight times in the data signal ϕDP. The data pattern corresponds to a filter pattern in which the first data value="0", X=16, the second data value="1", and Y=16.

Figure 4A:
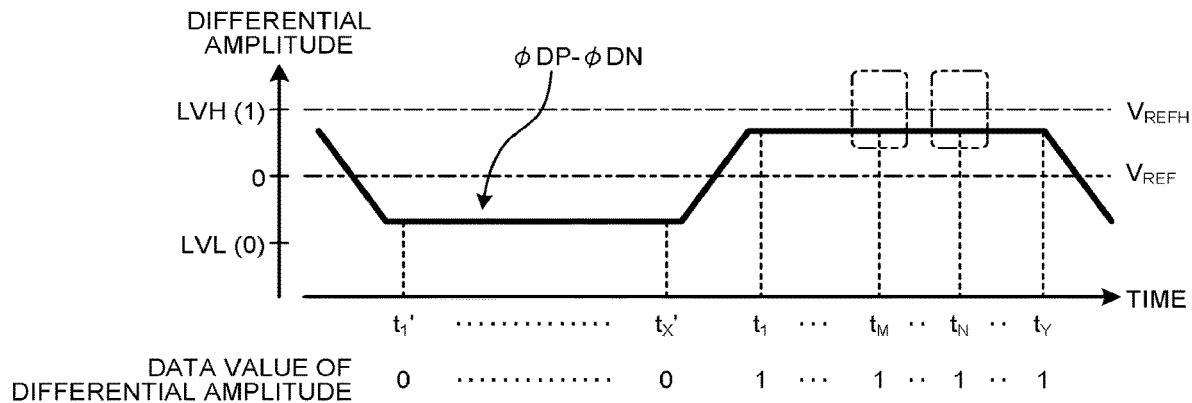
FIGS. 4A and 4B are waveform charts illustrating sampling timings in the embodiment.

For example, as illustrated in FIG. 4A, when sampling a period in which the data value "1" of the differential amplitude (ϕDP−ϕDN) of the data signal continues, the adaptive control logic circuit 33 can detect a first data pattern in which the first data value="0" continues for X bits and the second data value="1" continues for Y bits to estimate that the block is the EIEOS block and detect the EIEOS block (Yes in S2 of FIG. 3). FIG. 4A is a waveform diagram illustrating the sampling timing, in which a vertical axis represents the differential amplitude and a horizontal axis represents a time. A differential amplitude LVL indicates an L-level differential amplitude and corresponds to the data value "0". A differential amplitude LVH indicates an H-level differential amplitude and corresponds to the data value "1". In FIG. 4A, an example is illustrated in which Y sampling timings $t_1$ to $t_Y$ when the data value "1" of the differential amplitude (ϕDP−ϕDN) of the data signal continues after X sampling timings $t_1'$ to $t_x'$ when the data value "0" of the differential amplitude (ϕDP−ϕDN) of the data signal continues. As illustrated by being surrounded by a two-dot chain line in FIG. 4A, the amplitude error sampler 32 can compare a differential amplitude of an M-th bit sampling timing $t_M$ and a differential amplitude of an N-th bit sampling timing $t_N$ with the amplitude threshold $V_{REFH}$ in the latter half period of second to seventh data patterns among the data patterns repeated eight times. In the case of the third generation of the PCIe standard, X=8, Y=8, M=3, and N=7 may be set. In the case of the fourth generation of the PCIe standard, X=16, Y=16, M=7, and N=13 may be set.

Figure 4B:
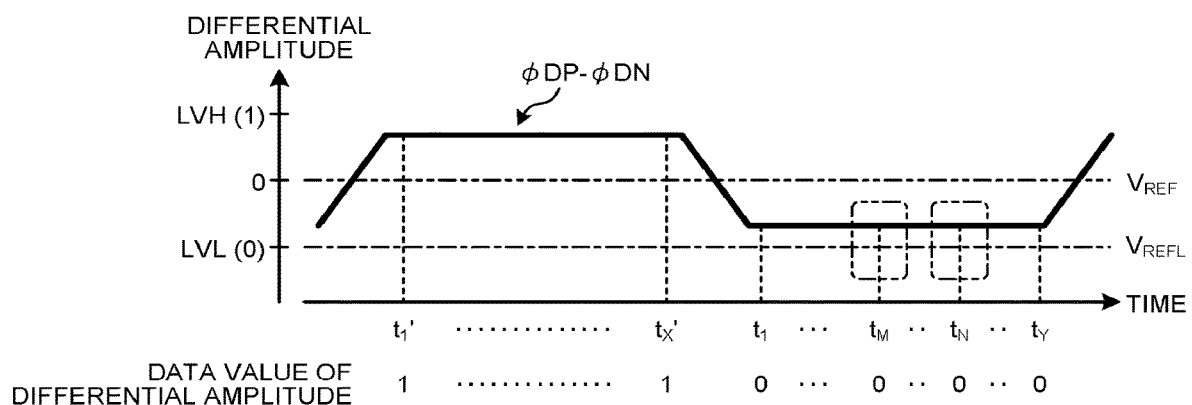

Alternatively, as illustrated in FIG. 4B, when sampling a period in which the data value "0" of the differential amplitude (ϕDP−ϕDN) of the data signal continues, the adaptive control logic circuit 33 can detect a first data pattern in which the first data value="1" continues for X bits and the second data value="0" continues for Y bits to estimate that the block is the EIEOS block and detect the EIEOS block (Yes in S2 of FIG. 3). FIG. 4B is a waveform diagram illustrating the sampling timing, and an example is illustrated in which Y sampling timings $t_1$ to $t_Y$ when the data value "0" of the differential amplitude (ϕDP−ϕDN) of the data signal continues after X sampling timings $t_1'$ to $t_x'$ when the data value "1" of the differential amplitude (ϕDP−ϕDN) of the data signal continues. As illustrated by being surrounded by a two-dot chain line in FIG. 4B, the amplitude error sampler 32 can compare a differential amplitude of an M-th bit sampling timing $t_M$ and a differential amplitude of an N-th bit sampling timing $t_N$ with the amplitude threshold $V_{REFL}$ in the latter half period of second to seventh data patterns among the data patterns repeated eight times.

The amplitude error sampler 32 outputs an error sampling result $E_H$="1" as a comparison result if the differential amplitude (ϕDP−ϕDN) of the data signal>the amplitude threshold $V_{REFH}$, and outputs an error sampling result $E_H$="0" as a comparison result if the differential amplitude (ϕDP−ϕDN) of the data signal<the amplitude threshold $V_{REFH}$. The error sampling result $E_H$="1" indicates that (absolute value of the differential amplitude (ϕDP−ϕDN) of data signal)>(absolute value of the amplitude threshold $V_{REFH}$). The error sampling result $E_H$="0" indicates that (absolute value of the differential amplitude (ϕDP−ϕDN) of data signal)<(absolute value of the amplitude threshold $V_{REFH}$). Thereby, the adaptive control logic circuit 33 may determine the magnitude relation between the absolute value of the differential amplitude of the M-th bit and the absolute value of the amplitude threshold $V_{REFH}$ and the magnitude relation between the absolute value of the differential amplitude of the N-th bit and the absolute value of the amplitude threshold $V_{REFH}$ according to the comparison result of the amplitude error sampler 32.

For example, when the differential amplitude of the data signal is not near the amplitude threshold $V_{REFH}$, the adaptive control logic circuit 33 adjusts the differential amplitude of the data signal so that the differential amplitude of the data signal is near the amplitude threshold $V_{REFH}$. The adaptive control logic circuit 33 adjusts a gain of the amplifier circuit 42 (for example, PGA) according to the fact that the magnitude relation between the absolute value of the differential amplitude of the M-th bit and the absolute value of the amplitude threshold $V_{REFH}$ and the magnitude relation between the absolute value of the differential amplitude of the N-th bit and the absolute value of the amplitude threshold $V_{REFH}$ are similar to each other in the latter half period of the data pattern.

Figure 5A:
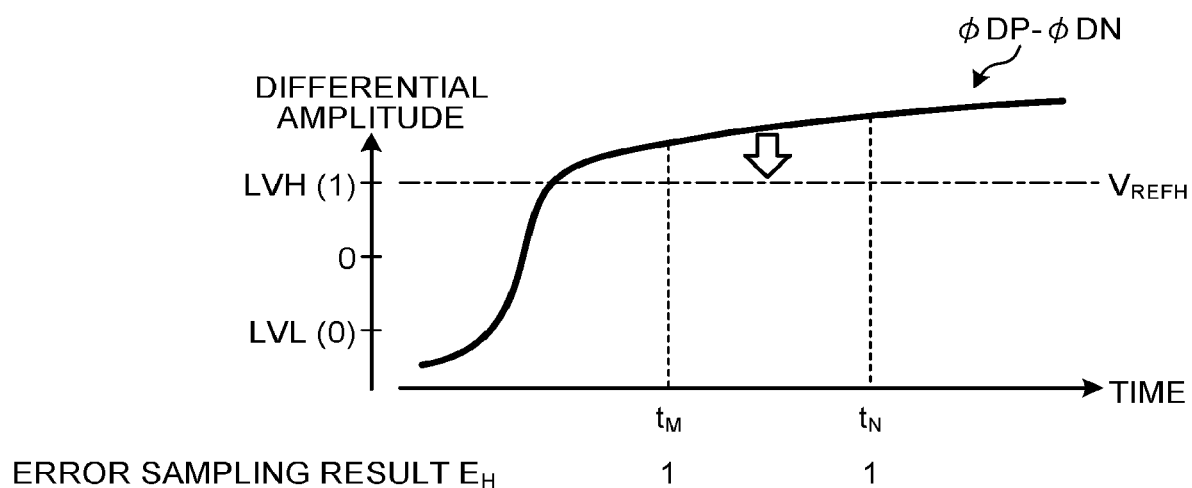
FIGS. 5A and 5B are diagrams illustrating error sampling results according to waveforms in the embodiment.

As illustrated in FIG. 5A, the adaptive control logic circuit 33 determines that the differential amplitude waveform of the data pattern is located in a high amplitude absolute value range larger than the amplitude threshold $V_{REFH}$ according to the fact that in the latter half period of the data pattern, the absolute value of the differential amplitude of the M-th sampling timing $t_M$ is larger than the absolute value of the amplitude threshold $V_{REFH}$ and the absolute value of the differential amplitude at the N-th sampling timing $t_N$ is larger than the absolute value of the amplitude threshold $V_{REFH}$ (Yes in S3). FIG. 5A is a diagram illustrating an example of the waveform in which the error sampling result is located in the high amplitude absolute value range. For example, the adaptive control logic circuit 33 determines that the differential amplitude waveform is located in the higher amplitude absolute value range than the amplitude threshold $V_{REFH}$ according to the error sampling results $E_H$ obtained at the sampling timings $t_M$ and $t_N$ as illustrated in FIG. 5A. The adaptive control logic circuit 33 lowers the gain of the amplifier circuit 42 according to the differential amplitude waveform being located in the higher amplitude absolute value range than the amplitude threshold $V_{REFH}$, as illustrated by the dotted white arrow in FIG. 5A (S4).

Figure 5B:
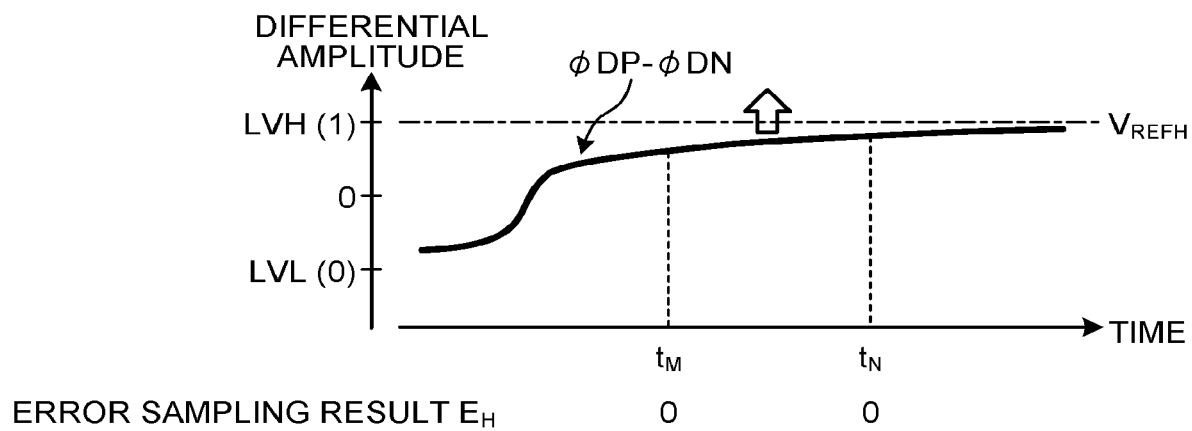

As illustrated in FIG. 5B, the adaptive control logic circuit 33 determines that the differential amplitude waveform of the data pattern is located in a low amplitude absolute value range smaller than the amplitude threshold $V_{REFH}$ according to the fact that in the latter half period of the data pattern, the absolute value of the differential amplitude of the M-th sampling timing $t_M$ is smaller than the absolute value of the amplitude threshold $V_{REFH}$ and the absolute value of the differential amplitude at the N-th sampling timing $t_N$ is smaller than the absolute value of the amplitude threshold $V_{REFH}$ (No in S3 and Yes in S5). FIG. 5B is a diagram illustrating an example of the differential amplitude waveform in which the error sampling result is located in the low amplitude absolute value range. For example, the adaptive control logic circuit 33 determines that the differential amplitude waveform is located in the lower amplitude absolute value range than the amplitude threshold $V_{REFH}$ according to the error sampling results $E_H$ obtained at the sampling timings $t_M$ and $t_N$ as illustrated in FIG. 5B. The adaptive control logic circuit 33 lowers the gain of the amplifier circuit 42 according to the differential amplitude waveform being located in the lower amplitude absolute value range than the amplitude thresholds $V_{REFH}$ and $V_{REFL}$ as illustrated by the dotted white arrow in FIG. 5B (S6).

In addition, the adaptive control logic circuit 33 adjusts the boost amount of the equalizer circuit 41 (for example, CTLE circuit) according to the fact that the magnitude relation between the absolute value of the differential amplitude of the M-th bit and the absolute value of the amplitude threshold $V_{REFH}$ and the magnitude relation between the absolute value of the differential amplitude of the N-th bit and the absolute value of the amplitude threshold $V_{REFH}$ are different in the latter half period of the data pattern.

Figure 6A:
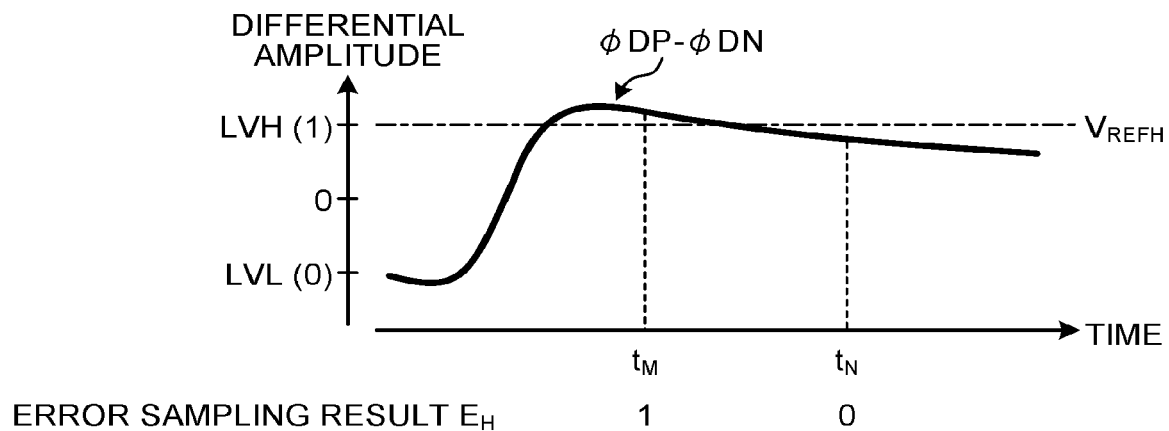
FIGS. 6A and 6B are diagrams illustrating other error sampling results according to other waveforms in the embodiment.

As illustrated in FIG. 6A, the adaptive control logic circuit 33 determines that the differential amplitude waveform of the data pattern is distorted in the overcompensated state according to the fact that in the latter half period of the data pattern, the absolute value of the differential amplitude of the M-th sampling timing $t_M$ is larger than the absolute value of the amplitude threshold $V_{REFH}$ and the absolute value of the differential amplitude at the N-th sampling timing $t_N$ is smaller than the absolute value of the amplitude threshold $V_{REFH}$ (No in S3, No in S5, and Yes in S7). In FIG. 6A, the error sampling result $E_H$="1" represents (absolute value of the differential amplitude ($\phi DP - \phi DN$) of the data signal)>(absolute value of the amplitude threshold $V_{REFH}$), and the error sampling result $E_H$="0" represents (absolute value of the differential amplitude ($\phi DP - \phi DN$) of the data signal)<(absolute value of the amplitude threshold $V_{REFH}$). For example, the adaptive control logic circuit 33 determines that the differential amplitude waveform is distorted in the overcompensated state according to the error sampling results $E_H$ obtained at the sampling timings $t_M$ and $t_N$ as illustrated in FIG. 6A. The adaptive control logic circuit 33 lowers the boost amount of the equalizer circuit 41 to reduce the compensation amount by, for example, the CTLE processing according to the differential amplitude waveform being distorted in the overcompensated state (S8).

Figure 6B:
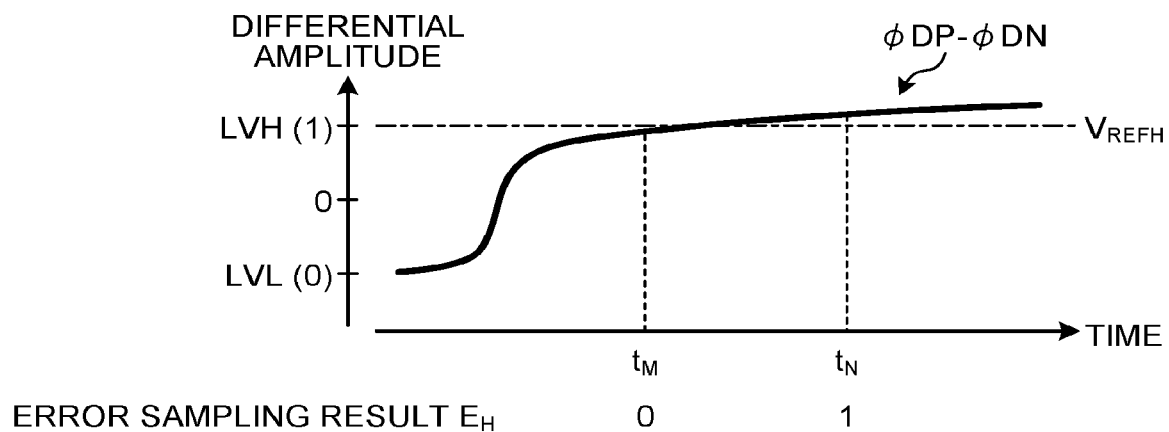

As illustrated in FIG. 6B, the adaptive control logic circuit 33 determines that the differential amplitude waveform of the data pattern is distorted in the undercompensated state according to the fact that in the latter half period of the data pattern, the absolute value of the differential amplitude of the M-th sampling timing $t_M$ is smaller than the absolute value of the amplitude threshold $V_{REFH}$ and the absolute value of the differential amplitude at the N-th sampling timing $t_N$ is larger than the absolute value of the amplitude threshold $V_{REFH}$ (No in S3, No in S5, and No in S7). In FIG. 6B, the error sampling result $E_H$="0" represents (absolute value of the differential amplitude ($\phi DP - \phi DN$) of the data signal)<(absolute value of the amplitude threshold $V_{REFH}$), and the error sampling result $E_H$="1" represents (absolute value of the differential amplitude ($\phi DP - \phi DN$) of the data signal)>(absolute value of the amplitude threshold $V_{REFH}$). For example, the adaptive control logic circuit 33 determines that the differential amplitude waveform is distorted in the undercompensated state according to the error sampling results $E_H$ obtained at the sampling timings $t_M$ and $t_N$ as illustrated in FIG. 6B. The adaptive control logic circuit 33 lowers the boost amount of the equalizer circuit 41 to increase the compensation amount by, for example, the CTLE processing according to the differential amplitude waveform being distorted in the undercompensated state (S9).

The semiconductor integrated circuit 1 can optimize the gain of the amplifier circuit 42 and the boost amount of the equalizer circuit 41 by repeating the loop of S1 to S9 illustrated in FIG. 3 plural times.

As described above, the semiconductor integrated circuit 1 of the present embodiment may adaptively control the AFE 4 including the equalizer circuit 41 and the amplifier circuit 42 depending on the magnitude relation between the absolute value of the differential amplitude of the data signal obtained by sampling at a plurality of timings and the absolute value of the amplitude threshold in the latter half period of the step response filter pattern. That is, the semiconductor integrated circuit 1 may adaptively control the AFE 4 depending on the magnitude relation between the absolute value of the differential amplitude and the absolute value of the amplitude threshold that are indicated by the plurality of sampling result by using as one filter pattern the data pattern in which the second data value continues plural times after the first data value continues plural times. Thereby, the frequency of receiving the filter pattern may be improved, and the adaptive control of the gain of the amplifier circuit 42 and the boost amount of the equalizer circuit 41 may be performed in a short time and with high accuracy.

Note that S1 may be omitted in the operation illustrated in FIG. 3, and the operation illustrated in FIG. 3 may be normally performed in parallel with the actual operation of the semiconductor integrated circuit 1.

Further, when the wired communication is communication according to a standard other than the PCIe standard, the low speed pattern may be used as the filter pattern if the reception of the low speed pattern that is not scrambled during the actual operation is guaranteed.

Figure 7:
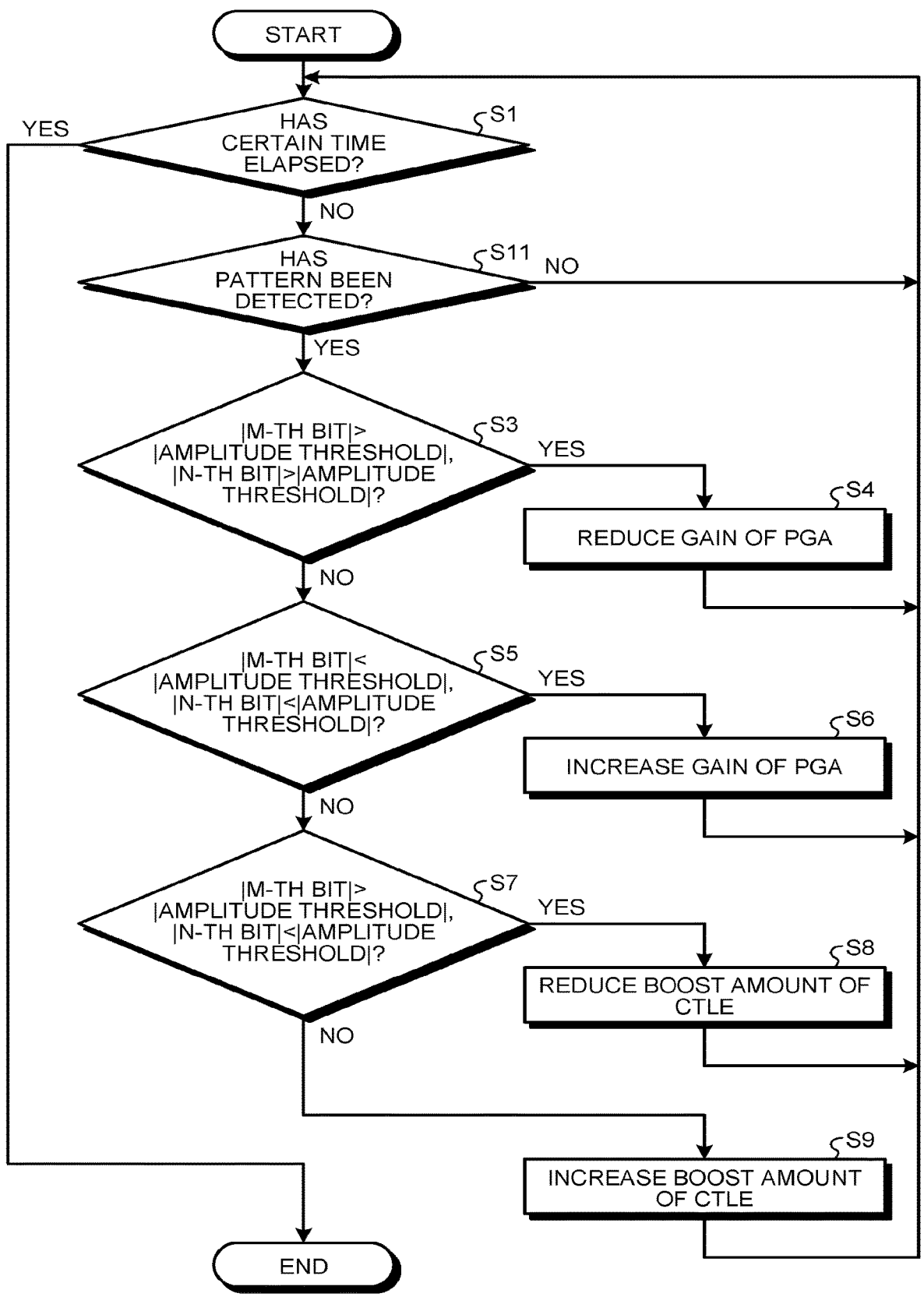
FIG. 7 is a flowchart illustrating an operation of a semiconductor integrated circuit according to a first modification of the embodiment.

In addition, when the reception of the low-speed pattern that is not scrambled during the actual operation is not guaranteed, a filter pattern having a shorter bit length than this low-speed pattern may be used. As a result, the filter pattern can be detected in a relatively short time even in the random pattern. In this case, the semiconductor integrated circuit 1 may perform an operation different from that of the embodiment in the following points, as illustrated in FIG. 7. FIG. 7 is a flowchart illustrating an operation of a semiconductor integrated circuit 1 according to a first modification of the embodiment. FIG. 7 includes similar process to a part of the processes of the flowchart illustrated in FIG. 3, and therefore processes different from FIG. 3 will be described in detail.

After (S1), the adaptive control logic circuit 33 receives the identification result of the data value from the data sampler 21, and determines according to the identification result whether or not to detect the data pattern in which the second data value continues Y times after the first data value continues X times (S11). At this time, X and Y may be relatively small values, for example, X=4 and Y=4. Thereafter, the same processes (S3 to S9) as in FIG. 3 can be performed.

As described above, by using a filter pattern having a short bit length, it is possible to detect a filter pattern even in random patterns in a relatively short time or at a high frequency.

Figure 8:
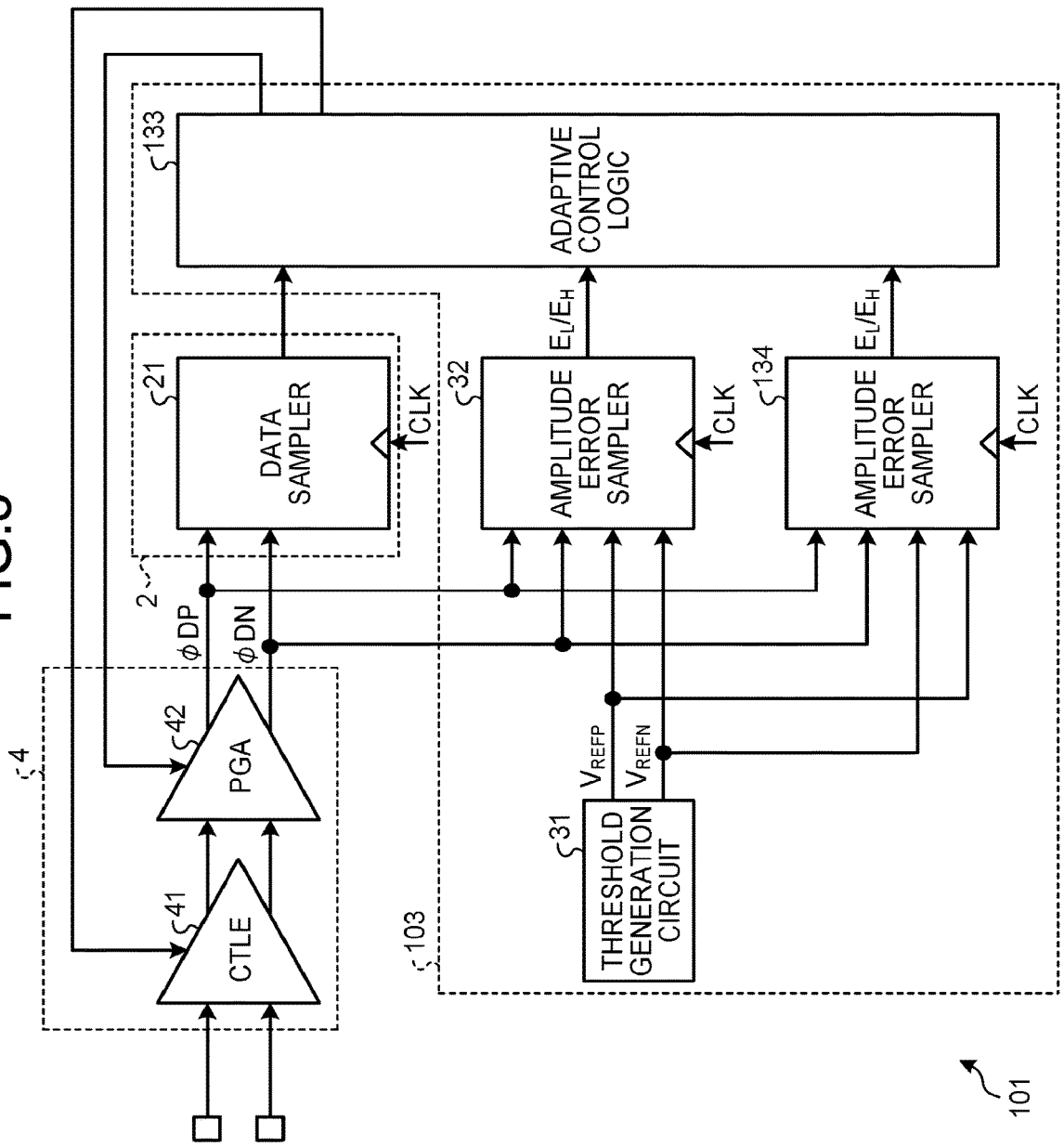
FIG. 8 is a diagram illustrating a configuration of a semiconductor integrated circuit according to a second modification of the embodiment.

In addition, the semiconductor integrated circuit 101 may be configured to perform the comparison of both the amplitude thresholds $V_{REFH}$ and $V_{REFL}$ using both data values "0" and "1" of the differential amplitude. FIG. 8 is a diagram illustrating a configuration of a semiconductor integrated circuit 101 according to a second modification of the embodiment. As illustrated in FIG. 8, the semiconductor integrated circuit 101 has a control circuit 103 instead of the control circuit 3 (see FIG. 2). The control circuit 103 further includes an amplitude error sampler 134. In the control circuit 103, for example, a comparison operation between a data value "1" of a differential amplitude ($\phi DP - \phi DN$) of a data signal and an amplitude threshold $V_{REF}H$ by the amplitude error sampler 32, and a comparison operation between a data value "0" of the differential amplitude ($\phi DP - \phi DN$) of the data signal and an amplitude threshold $V_{REFL}$ by the amplitude error sampler 134 can be performed in parallel.

Figure 9:
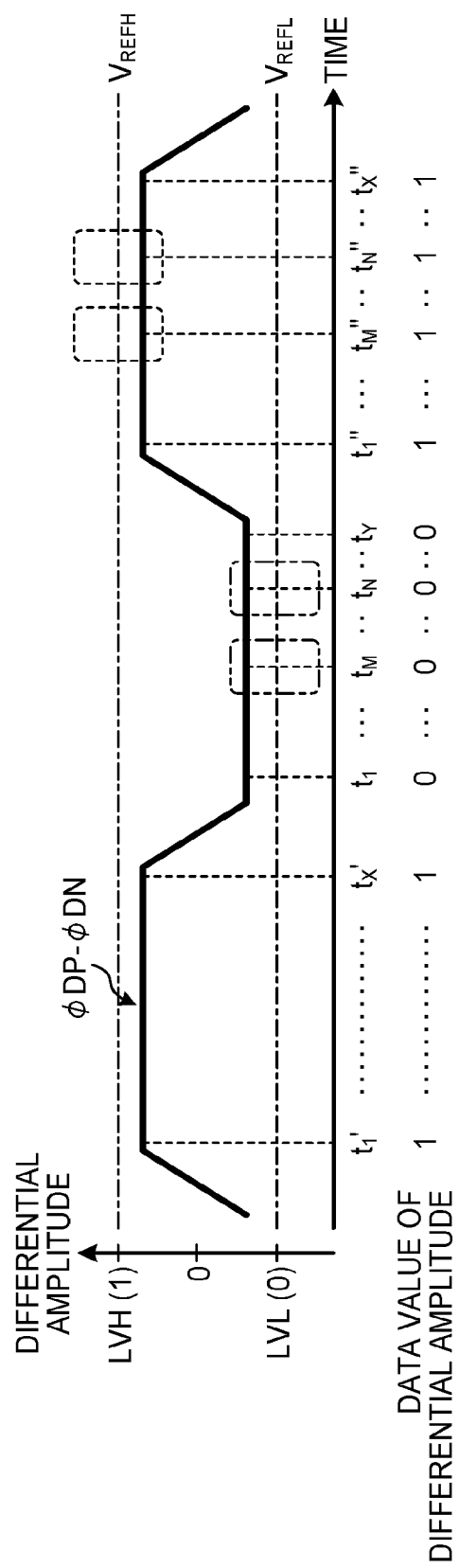
FIG. 9 is a waveform diagram illustrating a sampling timing in the second modification of the embodiment.

For example, the semiconductor integrated circuit 101 may continuously and/or alternately perform sampling in a period in which the data value "0" of the differential amplitude ($\phi DP - \phi DN$) of the data signal continues and sampling in a period in which the data value "1" of the differential amplitude ($\phi DP - \phi DN$) of the data signal continues by the amplitude error sampler 32 and the amplitude error sampler 134. FIG. 9 is a waveform diagram illustrating a sampling timing in the second modification of the embodiment. FIG. 9 illustrates X sampling timings $t_1'$ to $t_{X'}$ when the data value "1" continues, Y sampling timings $t_1$ to $t_Y$ when the data value "0" continues, and X sampling timings $t_1''$ to $t_{X}''$ when the data value "1" continues, for the differential amplitude ($\phi DP - \phi DN$) of the data signal. As illustrated by being surrounded by the two-dot chain line, the amplitude error sampler 134 can compare a differential amplitude of an M-th sampling timing $t_M$ and a differential amplitude of an N-th sampling timing $t_N$ with the amplitude threshold $V_{REFH}$ and the amplitude threshold $V_{REFL}$ in the period in which the data value "0" continues. In addition, as illustrated by being surrounded with a dotted line, the amplitude error sampler 32 can compare the differential amplitude of the M-th bit sampling timing $t_M''$ and the differential amplitude of the N-th sampling timing $t_N''$ with the amplitude threshold $V_{REFH}$ in the period in which the data value "1" continues after sampled in the period in which the data value "0" continues is sampled in the continuous period. As a result, the frequency of sampling by the amplitude error sampler 32 and the amplitude error sampler 134 may be easily increased, and the adaptive control of the boost amount of the equalizer circuit 41 may be performed in a shorter time and with higher accuracy.

As a result, the adaptive control logic circuit 133 may determine a magnitude relation of the absolute value of the differential amplitude of the M-th bit and the absolute values of the amplitude threshold $V_{REFH}$ and the amplitude threshold $V_{REFL}$ and a magnitude relation between the absolute value of the differential amplitude of the N-th bit and the absolute values of the amplitude threshold $V_{REFH}$ and the amplitude threshold $V_{REFL}$ according to the comparison result of the amplitude error sampler 32 and the comparison result of the amplitude error sampler 134. For example, when there is a mismatch between the comparison result of the amplitude error sampler 32 and the comparison result of the amplitude error sampler 134, the adaptive control logic circuit 133 can discard those comparison results and wait for the next comparison result to be supplied from the amplitude error samplers 32 and 134 and then perform the determination again.

In this way, the semiconductor integrated circuit 101 can improve the accuracy of the comparison result and the determination accuracy of the magnitude relation between the absolute value of the differential amplitude at the plurality of timings and the absolute value of the amplitude threshold by comparing both the amplitude thresholds $V_{REFH}$ and $V_{REFL}$ using the data values of both the differential amplitudes.

Figure 10:
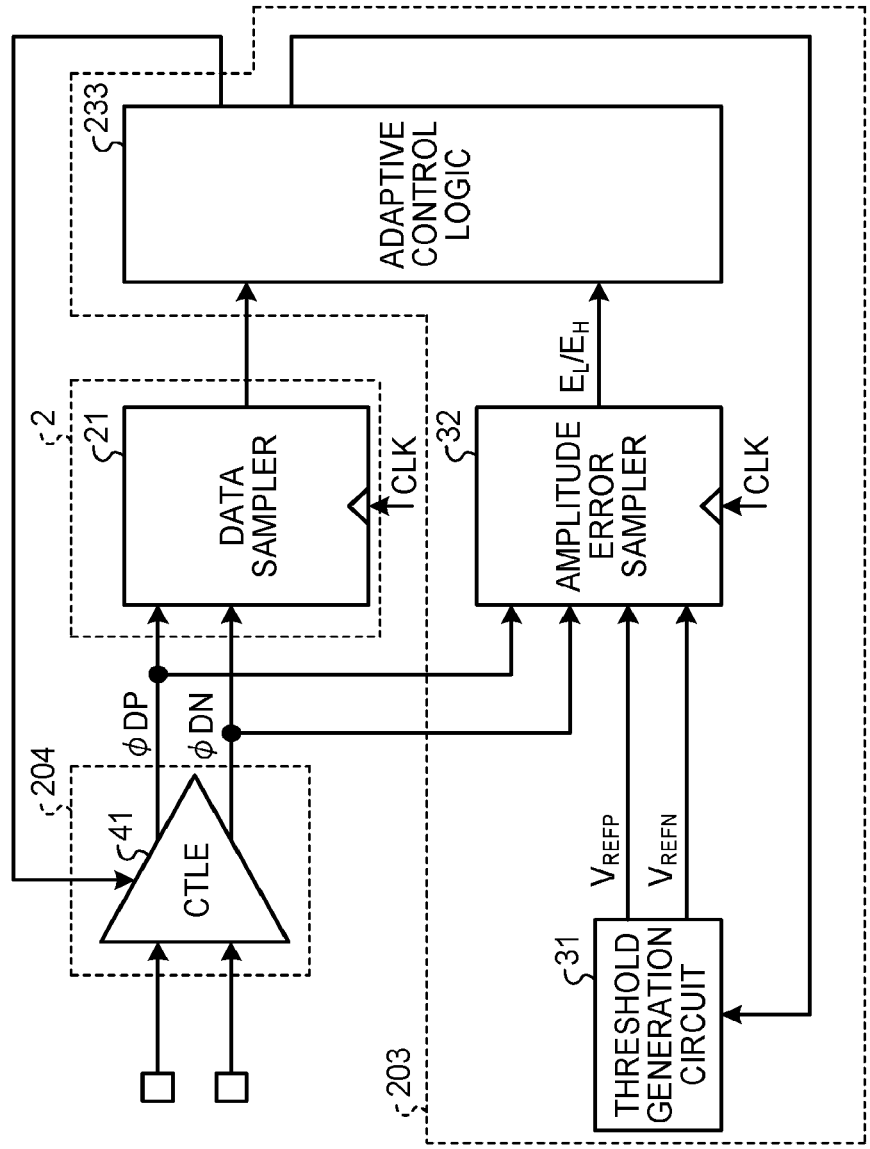
FIG. 10 is a diagram illustrating a configuration of a semiconductor integrated circuit according to a third modification of the embodiment.
Figure 11:
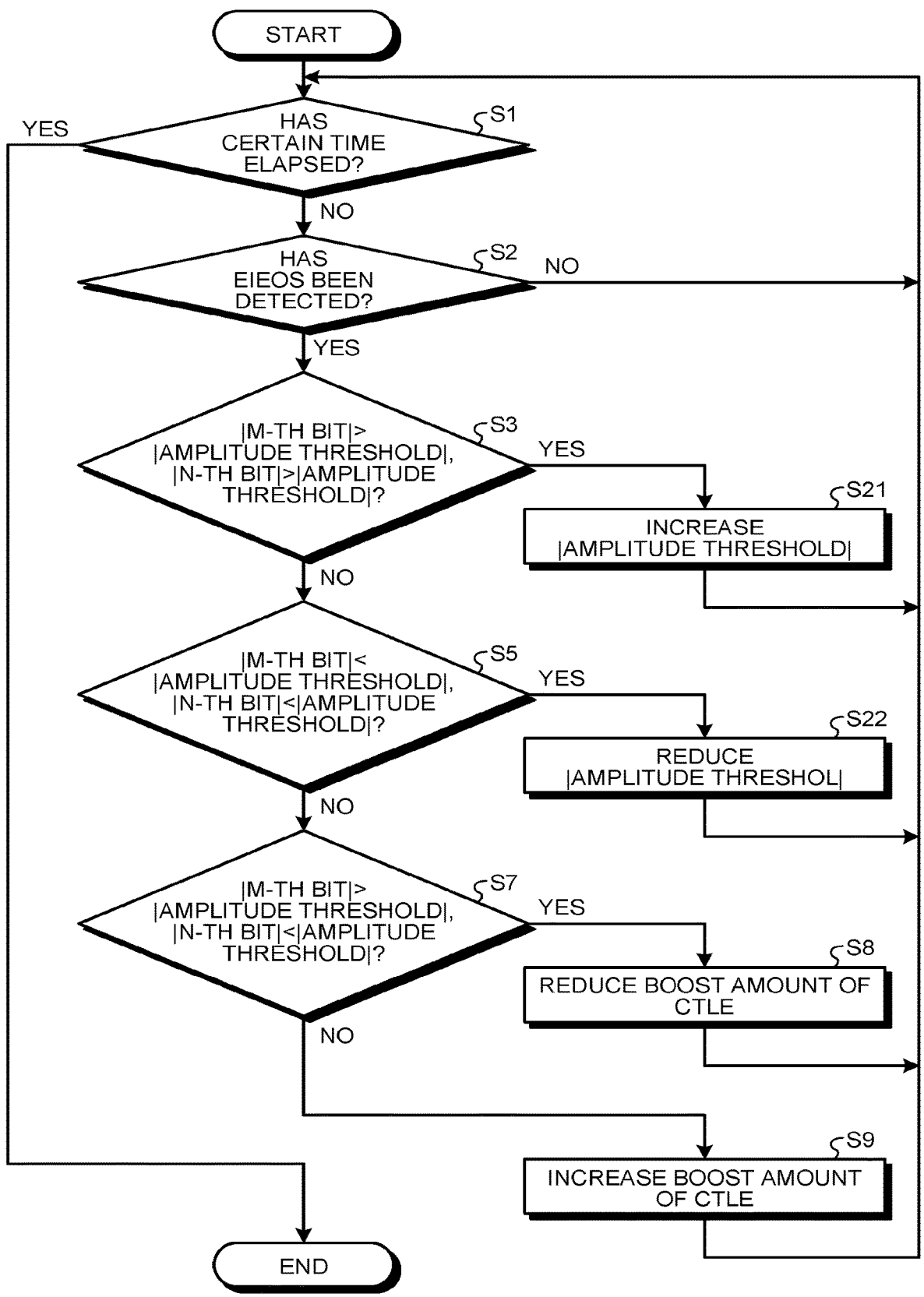
FIG. 11 is a flowchart illustrating an operation of the semiconductor integrated circuit according to the third modification of the embodiment.

Further, the semiconductor integrated circuit 201 may be configured so that the amplitude threshold itself can be adjusted according to the determination result of the magnitude relation between the absolute value of the amplitude at the plurality of timings and the absolute value of the amplitude threshold. FIG. 10 is a diagram illustrating a configuration of a semiconductor integrated circuit 201 according to a third modification of the embodiment. As illustrated in FIG. 10, the semiconductor integrated circuit 201 has an AFE 204 and a control circuit 203 instead of the AFE 4 and the control circuit 3 (see FIG. 2). In the AFE 204, the amplifier circuit 42 (see FIG. 2) is omitted. The control circuit 203 includes an adaptive control logic circuit 233 that operates differently from the adaptive control logic circuit 33. Specifically, the semiconductor integrated circuit 201 performs an operation different from that of the embodiment in the following points, as illustrated in FIG. 11. FIG. 11 is a flowchart illustrating an operation of the semiconductor integrated circuit according to the third modification of the embodiment. Here, a configuration different from the configuration illustrated in FIG. 3 will be described in detail.

Figure 12A:
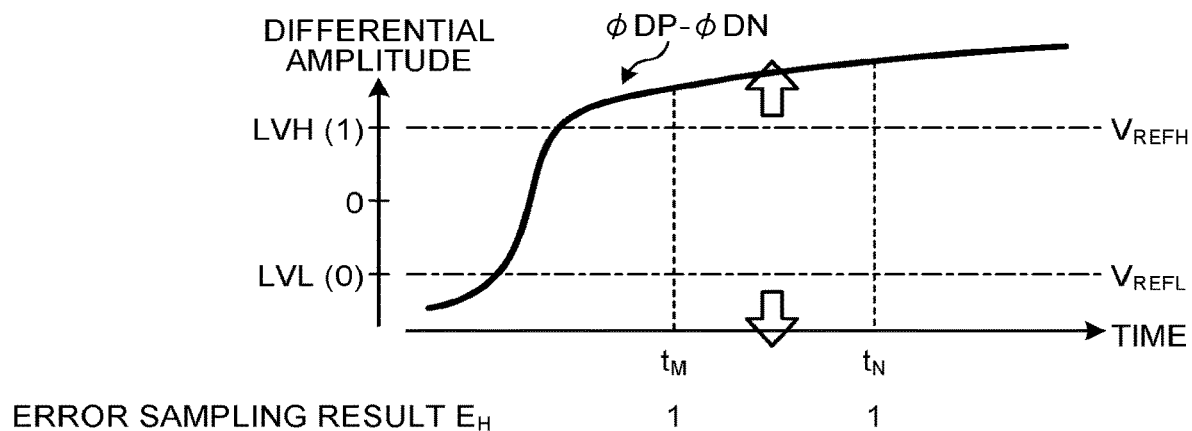
FIGS. 12A and 12B are diagrams illustrating error sampling results according to waveforms in the third modification of the embodiment.

In the semiconductor integrated circuit 201, the adaptive control logic circuit 233 determines that the waveform is located in a high amplitude absolute value range larger than the amplitude threshold $V_{REFH}$ as illustrated in FIG. 12A according to the fact that in the latter half period of the data pattern, the absolute value of the differential amplitude of the M-th sampling timing $t_M$ is larger than the absolute value of the amplitude threshold $V_{REFH}$ and the absolute value of the differential amplitude at the N-th sampling timing $t_N$ is larger than the absolute value of the amplitude threshold $V_{REFH}$ (Yes in S3). FIG. 12A is a diagram illustrating an example of the error sampling result according to the waveform located in the high amplitude absolute value range. For example, the adaptive control logic circuit 233 determines that the differential amplitude waveform is located in the high amplitude absolute value range according to the error sampling results $E_H$ obtained at the sampling timings $t_M$ and $t_N$ as illustrated in FIG. 12A. The adaptive control logic circuit 233 instructs the threshold generation circuit 31 to increase the absolute values of the amplitude threshold $V_{REFH}$ and the amplitude threshold $V_{REFL}$ to the high absolute value side as indicated by the dotted white arrows in FIG. 12A according to the differential amplitude waveform located in the high amplitude absolute value range (S21).

Figure 12B:
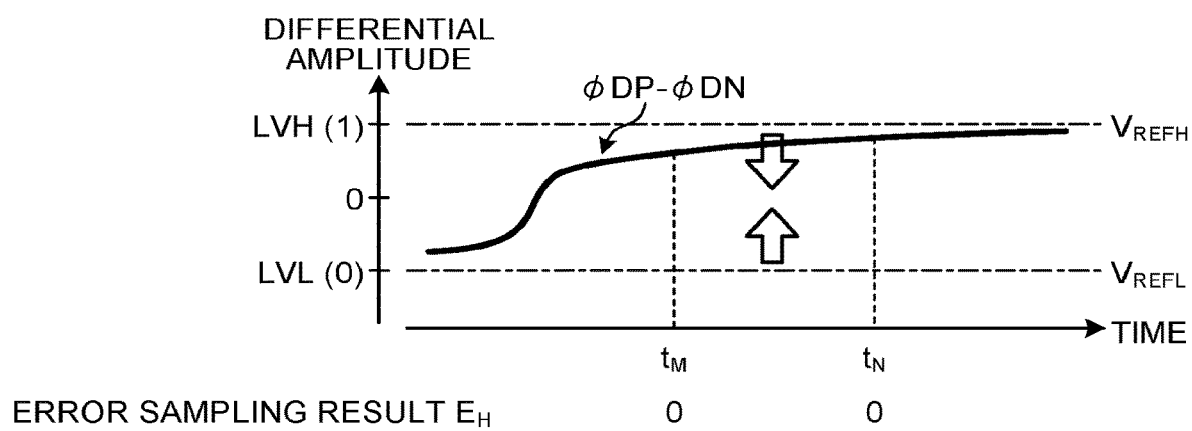

The adaptive control logic circuit 233 determines that the waveform is located in a low amplitude absolute value range smaller than the amplitude threshold $V_{REFH}$ as illustrated in FIG. 12B according to the fact that in the latter half period of the data pattern, the absolute value of the differential amplitude of the sampling timing $t_M$ is smaller than the absolute value of the amplitude threshold $V_{REFH}$ and the absolute value of the amplitude at the sampling timing $t_N$ is smaller than the absolute value of the amplitude threshold $V_{REFH}$ (No in S3 and Yes in S5). FIG. 12B is a diagram illustrating an example of the error sampling result according to the differential amplitude waveform located in the high amplitude absolute value range. For example, the adaptive control logic circuit 233 determines that the differential amplitude waveform is located in the low amplitude absolute value range according to the error sampling results $E_H$ obtained at the sampling timings $t_M$ and $t_N$ as illustrated in FIG. 12B, for example. The adaptive control logic circuit 233 instructs the threshold generation circuit 31 to reduce the absolute values of the amplitude threshold $V_{REFH}$ and the amplitude threshold $V_{REFL}$ to the low absolute value side as indicated by the dotted white arrows in FIG. 12B according to the differential amplitude waveform located in the low amplitude absolute value range (S22).

Note that in the operation illustrated in FIG. 11, a process of S11 of FIG. 7 may be performed instead of the process of S2.

In this way, the adaptive control logic circuit 33 can adjust the amplitude threshold $V_{REFH}$ and the amplitude threshold $V_{REFL}$ themselves so that the differential amplitude is near the amplitude threshold $V_{REFH}$ and the amplitude threshold $V_{REFL}$ according to the determination result of the differential amplitude of the data signal. Further, at this time, since the amplifier circuit 42 illustrated in FIG. 2 can be omitted, the configuration of the AFE 204 can be simplified.

Figure 13A:
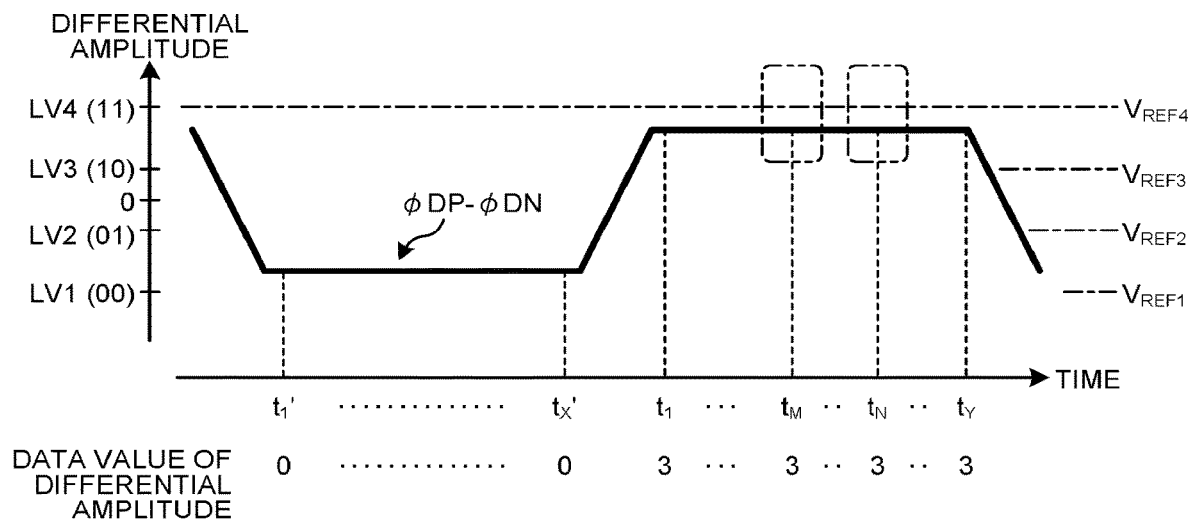
FIGS. 13A and 13B are waveform charts illustrating sampling timings in a fourth modification of the embodiment.
Figure 13B:
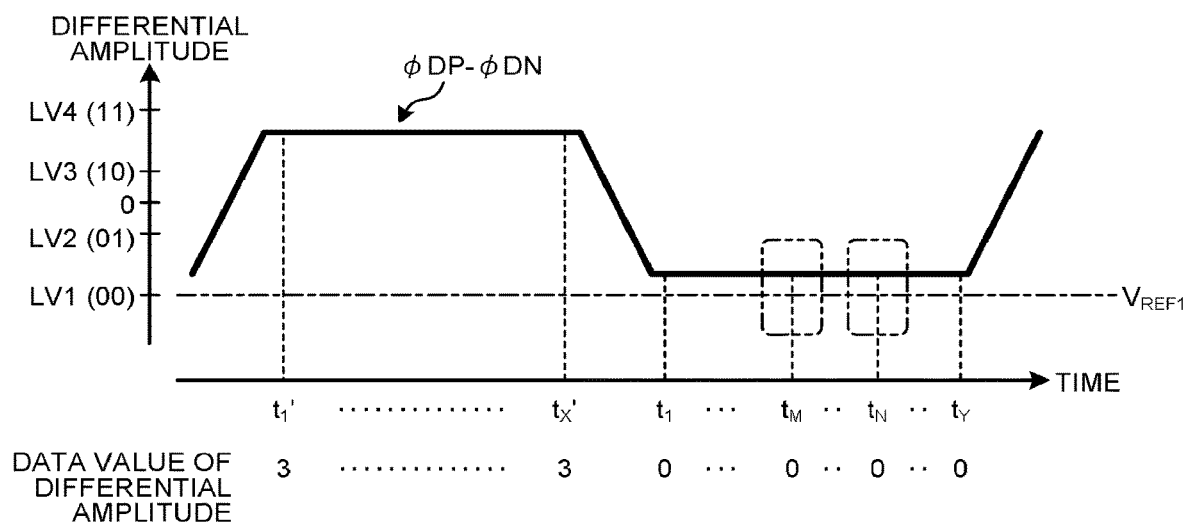

Further, the communication method used in the embodiment or the modification thereof may be multi-level pulse-amplitude modulation (PAM). For example, when the communication method is PAM4, the differential amplitude (φDP−φDN) of the data signal may take four differential amplitude levels LV1, LV2, LV3, and LV4, as illustrated in FIG. 13A. The four differential amplitude levels LV1, LV2, LV3, and LV4 represent bit patterns "00", "01", "10", and "11", respectively, and correspond to data values "0", "1", "2", and "3". FIGS. 13A and 13B each are waveform charts illustrating sampling timings in a fourth modification of the embodiment. At this time, a threshold generation circuit 331 (not illustrated) generates amplitude thresholds $V_{REFP1}$, $V_{REFP2}$, $V_{REFP3}$, and $V_{REFF4}$ corresponding to target amplitudes of the four signal levels of φDP, and amplitude thresholds $V_{REFN1}$, $V_{REFN2}$, $V_{REFN3}$, and $V_{REFN4}$ corresponding to target amplitudes of four signal levels of φDN. And the threshold generation circuit 331 supplies the generated amplitude thresholds $V_{REFP1}$, $V_{REFP2}$, $V_{REFP3}$, and $V_{REFP4}$ and $V_{REFN1}$, $V_{REFN2}$, $V_{REFN3}$, and $V_{REFN4}$ to an amplitude error sampler 332. Here, $V_{REFP1} < V_{REFP2} < 0 < R_{REFP3} < V_{REFP4}$ and, $V_{REFN1} > V_{REFN2} > V_{REFN3} > V_{REFN4}$. The amplitude error sampler 332 generates the differential amplitude threshold $V_{REF1}$ (=$V_{REFP1} - V_{REFN1}$), the differential amplitude threshold $V_{REF2}$ (=$V_{REFP2} - V_{REFN2}$), the differential amplitude threshold $V_{REF3}$ (=$V_{REFP3} - V_{REFN3}$), and the differential amplitude threshold $V_{REFP4}$ (=$V_{REFP4} - V_{REFN4}$) using the received $V_{REFP1}$ to $V_{REFP4}$ and $V_{REFN1}$ to $V_{REFN4}$. The amplitude thresholds $V_{REF1}$ to $V_{REF4}$ are thresholds for determining the amplitude error, that is, the degree of waveform distortion. The amplitude threshold $V_{REF1}$ is set to be an amplitude value near the target amplitude of the differential amplitude level LV1 corresponding to the data value "00" of the differential amplitude (φDP−φDN). The amplitude threshold $V_{REF2}$ is set to be an amplitude value near the target amplitude of the differential amplitude level LV2 corresponding to the data value "01" of the differential amplitude (φDP−φDN). The amplitude threshold $V_{REF3}$ is set to be an amplitude value near the target amplitude of the differential amplitude level LV3 corresponding to the data value "10" of the differential amplitude (φDP−φDN). The amplitude threshold $V_{REF4}$ is set to be an amplitude value near the target amplitude of the differential amplitude level LV4 corresponding to the data value "11" of the differential amplitude (φDP−φDN). In FIG. 13A, an example is illustrated in which Y sampling timings $t_1$ to $t_Y$ when the data value "3" of the differential amplitude (φDP−φDN) of the data signal continues after X sampling timings $t_1'$ to $t_x'$ when the data value "0" of the differential amplitude (φDP−φDN) of the data signal continues. In FIG. 13B, an example is illustrated in which Y sampling timings $t_1$ to $t_Y$ when the data value "0" of the differential amplitude (φDP−φDN) of the data signal continues after X sampling timings $t_1'$ to $t_x'$ when the data value "3" of the differential amplitude (φDP−φDN) of the data signal continues.

For example, as illustrated in FIG. 13A, when sampling a period in which the data value "3" of the differential amplitude (ϕDP−ϕDN) of the data signal continues, as illustrated by being surrounded by a two-dot chain line in FIG. 13A, the amplitude error sampler 332 compares the differential amplitude of the M-th sampling timing $t_M$ and the N-th sampling timing $t_N$ with the amplitude threshold $V_{REF4}$ in the latter half period of one cycle of the data pattern. The amplitude error sampler 332 outputs an error sampling result $E_4$="1" as a comparison result if the differential amplitude (ϕDP−ϕDN) of the data signal>the amplitude threshold $V_{REF4}$, and outputs an error sampling result $E_4$="0" as a comparison result if the differential amplitude (ϕDP−ϕDN) of the data signal<the amplitude threshold $V_{REF4}$. The error sampling result $E_4$="1" indicates that (absolute value of the differential amplitude (ϕDP−ϕDN) of data signal)>(absolute value of the amplitude threshold $V_{REF4}$). The error sampling result $E_4$="0" indicates that (absolute value of the amplitude of the differential amplitude (ϕDP−ϕDN) of data signal)<(absolute value of the amplitude threshold $V_{REF4}$).

Alternatively, as illustrated in FIG. 13B, when sampling a period in which the data value "0" of the differential amplitude (ϕDP−ϕDN) of the data signal continues, as illustrated by being surrounded by a two-dot chain line in FIG. 13B, the amplitude error sampler 332 can compare the differential amplitude of the M-th sampling timing $t_R$ and the N-th sampling timing to with the amplitude threshold $V_{REF1}$ in the latter half period of the data pattern. The amplitude error sampler 332 outputs an error sampling result $E_1$="1" as a comparison result if the differential amplitude (ϕDP−ϕDN) of the data signal>the amplitude threshold $V_{REF1}$, and outputs an error sampling result $E_1$="0" as a comparison result if the differential amplitude (ϕDP−ϕDN) of the data signal ϕ>the amplitude threshold $V_{REF1}$. The error sampling result $E_1$="1" indicates that (absolute value of the differential amplitude (ϕDP−ϕDN) of data signal)>(absolute value of the amplitude threshold $V_{REF1}$). The error sampling result $E_1$="0" indicates that (absolute value of the differential amplitude (ϕDP−ϕDN) of data signal)<(absolute value of the amplitude threshold $V_{REF}$).

Note that FIGS. 13A and 13B illustrate a case where the differential amplitude level LV4 or LV1 having a larger amplitude absolute value among the four differential amplitude levels LV1 to LV4 of the data signal is used for the adaptive control of the equalizer circuit 41, but the present embodiment is not limited thereto, and another differential amplitude level may be used for the adaptive control of the equalizer circuit 41.

In this way, even when the communication method is the multi-level amplitude modulation, the semiconductor integrated circuit 1 can adaptively control the equalizer circuit 41 according to the magnitude relation between the absolute value of the differential amplitude of the data at the plurality of timing and the absolute value of the threshold during the latter half period of the data pattern.

Figure 14:
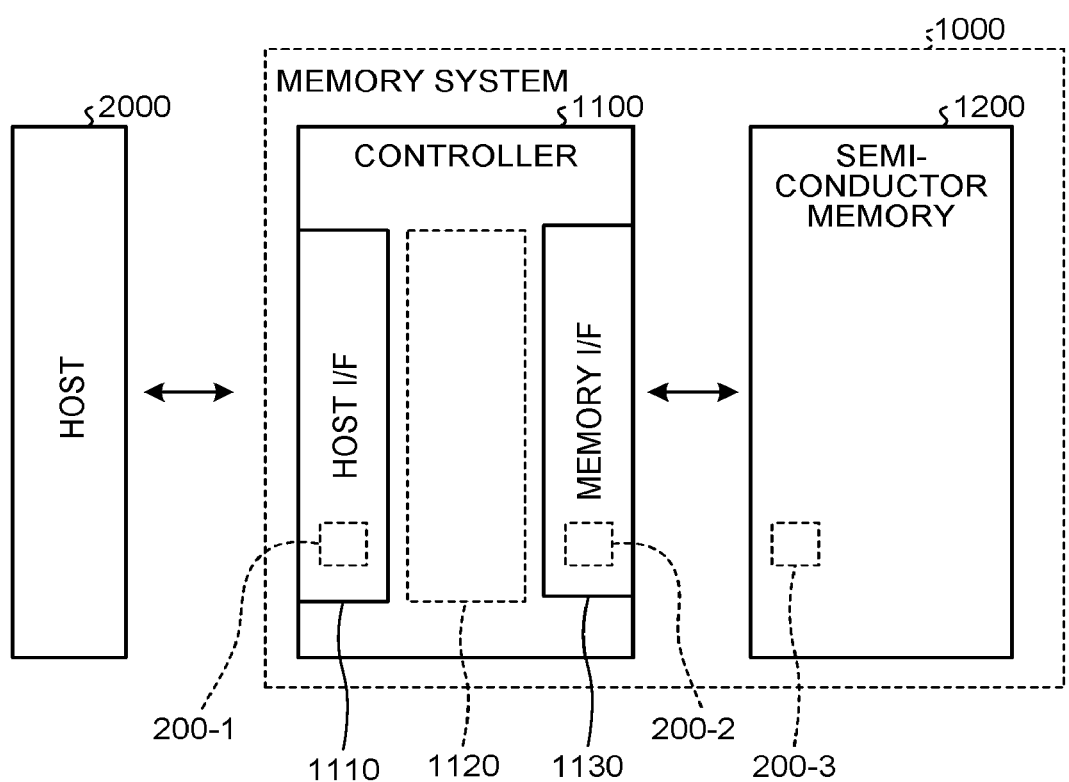
FIG. 14 is a diagram illustrating a configuration of a memory system to which a receiving apparatus including the semiconductor integrated circuit according to the embodiment and the first to third modifications thereof is applied.

Next, a memory system 1000 to which the receiving apparatus including the semiconductor integrated circuit according to the embodiment and the first to third modifications thereof is applied will be described with reference to FIG. 14. FIG. 14 is a diagram illustrating a configuration of a memory system to which a receiving apparatus including the semiconductor integrated circuit according to the embodiment and the first to third modifications thereof is applied.

The memory system 1000 can be connected to a host 2000 and can function as an external storage medium of the host 2000. The host 2000 is, for example, a personal computer, and the memory system 1000 is, for example, an SSD. The memory system 1000 has a controller 1100 and a semiconductor memory 1200. The controller 1100 is a circuit as hardware, and includes a host interface circuit (host I/F) 1110, a signal processing circuit 1120, and a memory interface circuit (memory I/F) 1130.

For example, the host I/F 1110 has a receiving apparatus 200-1. The receiving apparatus 200-1 is applicable to any of the receiving apparatuses including the semiconductor integrated circuit according to the embodiment and the first to third modifications thereof. The host I/F 1110 receives a particular signal from the host 2000. The host I/F 1110 generates a differential data signal from the particular signal and transmits the generated differential data signal to the receiving apparatus 200-1. The receiving apparatus 200-1 generates a data signal for signal processing from the differential data signal and supplies the generated data signal to the signal processing circuit 1120. Thereby, the data signal of the signal processing may be properly used in the signal processing circuit 1120.

The memory I/F 1130 has a receiving apparatus 200-2. The receiving apparatus 200-2 is applicable to any of the receiving apparatuses including the semiconductor integrated circuit according to the embodiment and the first to third modifications thereof. The memory I/F 1130 receives a particular signal from the signal processing circuit 1120. The memory I/F 1130 generates the differential data signal from the particular signal and transmits the generated differential data signal to the receiving apparatus 200-2. The receiving apparatus 200-2 generates a data signal for transmission from the differential data signal and supplies the generated data signal to the semiconductor memory 1200. As a result, the data signal for transmission may be properly transmitted to the semiconductor memory 1200.

The semiconductor memory 1200 has a receiving apparatus 200-3. The receiving apparatus 200-3 is applicable to any of the receiving apparatuses including the semiconductor integrated circuit according to the embodiment and the first to third modifications thereof. The semiconductor memory 1200 receives a data signal for transmission from the memory I/F 1130. The semiconductor memory 1200 transfers the data signal for transmission to the receiving apparatus 200-3. The receiving apparatus 200-2 generates the internal data signal from the data signal for transmission and supplies the generated internal data signal to peripheral circuits in the semiconductor memory 1200. Thereby, the internal data signal may be properly used in the semiconductor memory 1200.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor integrated circuit comprising:
  a first circuit configured to output a second signal obtained by changing a frequency characteristic of a first signal, the first signal including a pattern that has a first period and has a second period after the first period, the first period being a period in which the first signal has a first level, the second period being a period in which the first signal has a second level, the second level being different from the first level; and a second circuit configured to sample an amplitude of the output second signal at a plurality of timings every given cycle in a period corresponding to the second period of the pattern, and to control a parameter relating to the frequency characteristic for the first circuit according to a first magnitude relation and a second magnitude relation, the first magnitude relation being a relation between an absolute value of a first amplitude and a first threshold, the first amplitude being an amplitude sampled at a first timing among the plurality of timings, the second magnitude relation being a relation between an absolute value of a second amplitude and the first threshold, the second amplitude being an amplitude sampled at a second timing, the second timing being a timing after the first timing among the plurality of timings.

2. The semiconductor integrated circuit according to claim 1, wherein
the second circuit is configured to control a parameter relating to a boost amount of a certain frequency as the parameter according to the first magnitude relation and the second magnitude relation being different from each other.

3. The semiconductor integrated circuit according to claim 2, wherein
the second circuit is configured to control the parameter to reduce the boost amount according to the absolute value of the first amplitude being larger than an absolute value of the first threshold and to the absolute value of the second amplitude being smaller than the absolute value of the first threshold, and to control the parameter to increase the boost amount according to the absolute value of the first amplitude being smaller than the absolute value of the first threshold and to the absolute value of the second amplitude being larger than the absolute value of the first threshold.

4. The semiconductor integrated circuit according to claim 1, further comprising:
an amplifier circuit electrically connected between the first circuit and the second circuit, wherein
the second circuit is configured to control a parameter relating to a gain of the second signal for the first signal as the parameter according to the first magnitude relation and the second magnitude relation being similar to each other.

5. The semiconductor integrated circuit according to claim 4, wherein
the second circuit is configured to control the parameter to reduce the gain according to the absolute value of the first amplitude being larger than the absolute value of the first threshold and to the absolute value of the second amplitude being larger than the absolute value of the first threshold, and to control the parameter to increase the gain of the amplifier circuit according to the absolute value of the first amplitude being smaller than the absolute value of the first threshold and to the absolute value of the second amplitude being smaller than the absolute value of the first threshold.

6. The semiconductor integrated circuit according to claim 1, wherein
the second circuit is configured to adjust the first threshold according to the first magnitude relation and the second magnitude relation indicating similar tendency to each other.

7. The semiconductor integrated circuit according to claim 6, wherein
the second circuit is configured to increase the absolute value of the first threshold according to the absolute value of the first amplitude being larger than the absolute value of the first threshold and to the absolute value of the second amplitude being larger than the absolute value of the first threshold, and to reduce the absolute value of the first threshold value according to the absolute value of the first amplitude being smaller than the absolute value of the first threshold and to the absolute value of the second amplitude being smaller than the absolute value of the first threshold.

8. The semiconductor integrated circuit according to claim 1, wherein
the first circuit includes a CTLE (Continuous Time Linear Equalizer) circuit, and
the parameter is a parameter relating to a boost amount of the CTLE circuit.

9. The semiconductor integrated circuit according to claim 8, wherein
the second circuit is configured to control the parameter relating to the boost amount of the CTLE circuit according to the first magnitude relation and the second magnitude relation being different from each other.

10. The semiconductor integrated circuit according to claim 1, wherein
the first circuit includes an amplifier circuit, and
the parameter is a parameter relating to a gain of the amplifier circuit.

11. The semiconductor integrated circuit according to claim 10, wherein
the second circuit is configured to control the parameter relating to the gain of the amplifier circuit according to the first magnitude relation and the second magnitude relation being similar to each other.

12. The semiconductor integrated circuit according to claim 1, wherein
the second circuit includes
a data sampler configured to sample the amplitude of the second signal and to identify a data value, and
an error sampler configured to sample the amplitude of the second signal and to determine the magnitude relation for the first threshold, and wherein
the parameter is a parameter relating to the first threshold used in determination by the error sampler.

13. The semiconductor integrated circuit according to claim 12, wherein
the second circuit is configured to adjust the first threshold used in determination by the error sampler according to the first magnitude relation and the second magnitude relation indicating similar tendency to each other.

14. The semiconductor integrated circuit according to claim 1, wherein
the pattern includes a pattern having a relatively low frequency among a plurality of patterns included in the first signal.

15. A receiving apparatus, comprising:
a receiving node; and
the semiconductor integrated circuit according to claim 1 that is electrically connected to the receiving node.

16. The receiving apparatus according to claim 15, wherein
the second circuit is configured to control a parameter relating to a boost amount of a certain frequency as the parameter according to the first magnitude relation and the second magnitude relation being different from each other.

17. The receiving apparatus according to claim 15, further comprising:
an amplifier circuit electrically connected between the first circuit and the second circuit,
wherein the second circuit is configured to control a parameter relating to a gain of the second signal for the first signal as the parameter according to the first magnitude relation and the second magnitude relation being similar to each other.

18. The receiving apparatus according to claim 15, wherein
the second circuit is configured to adjust the first threshold according to the first magnitude relation and the second magnitude relation indicating similar tendency to each other.

19. A receiving circuit according to claim 15, wherein
the receiving node is configured to receive a signal complying with a PCIe (Peripheral Component Interconnect Express) standard, and
the pattern is a pattern of EIEOS (Electrical Idle Exit Ordered Set) of the PCIe.

20. A memory device, comprising:
a semiconductor memory; and
a controller circuit configured to at least include the receiving apparatus according to claim 15, and an interface circuit configured to transmit a write data corresponding to data received via the receiving apparatus to the semiconductor memory.

* * * * *